(12) United States Patent
Boesser et al.

(10) Patent No.: US 7,864,319 B2
(45) Date of Patent: Jan. 4, 2011

(54) DEVICE AND METHOD FOR DETERMINING AN OPTICAL PROPERTY OF A MASK

(75) Inventors: Hans-Artur Boesser, Breidenbach (DE); Michael Heiden, Woelfersheim (DE); Klaus Rinn, Heuchelheim (DE); Frank Laske, Weilburg (DE)

(73) Assignee: Vistec Semiconductor System GmbH, Weilburg (DE)

( * ) Notice: Subject to any disclaimer, the term of this patent is extended or adjusted under 35 U.S.C. 154(b) by 335 days.

(21) Appl. No.: 12/229,087

(22) Filed: Aug. 20, 2008

(65) Prior Publication Data
US 2009/0066955 A1    Mar. 12, 2009

(30) Foreign Application Priority Data
Sep. 6, 2007    (DE)    ........................ 10 2007 042 273

(51) Int. Cl.
*G01B 11/00*    (2006.01)
(52) U.S. Cl. .................................................... 356/388
(58) Field of Classification Search .................... None
See application file for complete search history.

(56) References Cited

U.S. PATENT DOCUMENTS

| 5,563,702 | A | 10/1996 | Emery et al. |
| 7,298,496 | B2* | 11/2007 | Hill ........................... 356/512 |
| 7,355,690 | B2* | 4/2008 | Elyasaf et al. ........... 356/237.2 |
| 2005/0254068 | A1 | 11/2005 | Rinn et al. |

* cited by examiner

*Primary Examiner*—Tu T Nguyen
(74) *Attorney, Agent, or Firm*—Simpson & Simpson, PLLC

(57) ABSTRACT

A coordinate measuring machine (1) including a plane (25a) in which there is arranged a movable measurement table (20) moving the mask (2) correspondingly in the plane (25a), at least one objective (9) and a detector (11), an incident light source (14) arranged to provide incident light and/or a transmitted light source (6) arranged to provide transmitted light, wherein the mask (2) has at least a first area (41) and a second area (42), wherein the first area (41) and the second area (42) comprise different materials differing in their transmission or reflection properties.

15 Claims, 3 Drawing Sheets

DEVICE AND METHOD FOR DETERMINING AN OPTICAL PROPERTY OF A MASK

CROSS REFERENCE TO RELATED APPLICATIONS

This patent application claims priority of German Patent Application No. 10 2007 042 273.5, filed on Sep. 6, 2007, the application is incorporated herein by reference.

FIELD OF THE INVENTION

The present invention relates to a coordinate measuring machine for determining the optical property of a mask.

The invention further relates to a method for determining optical properties of a mask. In particular, the method is realized in a coordinate measuring machine including a measurement table movable in a plane. The measurement table moves the masks correspondingly in the plane. There are further arranged an illumination and imaging means, wherein the imaging means includes at least one objective and a detector. The illumination means includes a light source in an incident light optical path and/or a light source in a transmitted light optical path.

BACKGROUND OF THE INVENTION

A coordinate measuring device and a method of the category-defining type are known from the published application DE 102004023739. Therein, a mask is also arranged on a measurement table translatable in the X-coordinate direction and in the Y-coordinate direction. There are further provided imaging optics and a detector. The mask may be illuminated with an incident light illumination means and/or a transmitted light illumination means.

SUMMARY OF THE INVENTION

In one embodiment, the current invention comprises a coordinate measuring machine for determining the optical properties of a mask including a movable measurement table for moving the mask within a plane, wherein the mask includes a first area and a second area, wherein the first area and the second area comprise materials differing in their respective transmission or reflection properties with respect to each other, an illumination means and an imaging means, wherein the imaging means includes an objective and a detector, wherein the objective images the first area and the second area on the detector either sequentially or simultaneously, wherein the illumination means emits light along an incident light optical path or emits a light along a transmitted light optical path, and at least one monitor detector with an associated coupling-out element for providing the monitor detector with a portion of the light from the illumination means that is directed along at least one of the optical paths. In one embodiment the first and second areas are arbitrarily distributed on the mask and are not adjacent to each other. In another embodiment, the first and second areas on the mask are arranged such that the first and second areas are adjacent to each other. In a further embodiment, the first area and the second area consist of different materials applied to a surface of the mask.

In one embodiment, the first area and the second area consist of different materials, wherein the second area comprises a surface of the mask. In another embodiment, the first area and the second area consist of different materials, wherein the first area covers an entire surface of the mask and the second area is partially deposited on the first area. In yet another embodiment, the first area and the second area on the mask are larger than a resolution of the imaging means. In a further embodiment, the first area and the second area have a total size of about 10 μm.

The current invention also comprises a method for determining optical properties of a mask, wherein a coordinate measuring machine includes a measurement table movable in a plane that moves the mask correspondingly in the plane, wherein illumination and imaging means are provided, wherein the imaging means includes at least one objective and a detector, and wherein the illumination means emits light along an incident light optical path or a light source in a transmitted light optical path, including the steps of:

(a) providing the mask, wherein the mask includes a first area and a second area wherein the first area and the second area are made of different materials;
(b) imaging sequentially or simultaneously the first and second areas on the detector via the objective, wherein the first and second areas differ in their transmission or reflection properties;
(c) coupling out a portion of the light emitted from the illumination means to at least one monitor detector to generate a signal; and
(d) using the signal of the monitor detector to compensate intensity fluctuations of the illumination means between a measuring of the first area and a measuring of the second area.

In one embodiment, the first and second areas are arbitrarily distributed on the mask and are not adjacent to each other. In another embodiment, the first and second areas are arranged on the mask such that the first and second areas are adjacent to each other. In yet another embodiment, the first area and the second area consist of different materials applied to a surface of the mask. In yet another embodiment, the first area and the second area consist of different materials, wherein the second area comprises a surface of the mask. In still another embodiment, the first area and the second area consist of different materials, wherein the first area covers an entire surface of the mask and the second area is deposited on the first area. In another embodiment, the first area or the second area, or a sum of the first and second areas, on the mask is larger than a resolution of the imaging means.

The first and the second areas differ in their transmission properties or reflection properties. Preferably, the mask consists of $SiO_2$. The material applied in the first or second area may be, for example, a chromium layer or a phase-shifting material (MoSi). Titanium nitride (TiN) is also contemplated. The materials in the first and second areas differ from each other. If no material is applied in one area, the material of the mask is available for the measurement. This material is preferably $SiO_2$.

BRIEF DESCRIPTION OF THE DRAWINGS

In the following, embodiments will explain the invention and its advantages in more detail with reference to the accompanying drawings, in which.

DETAILED DESCRIPTION OF THE INVENTION

Figure 1:
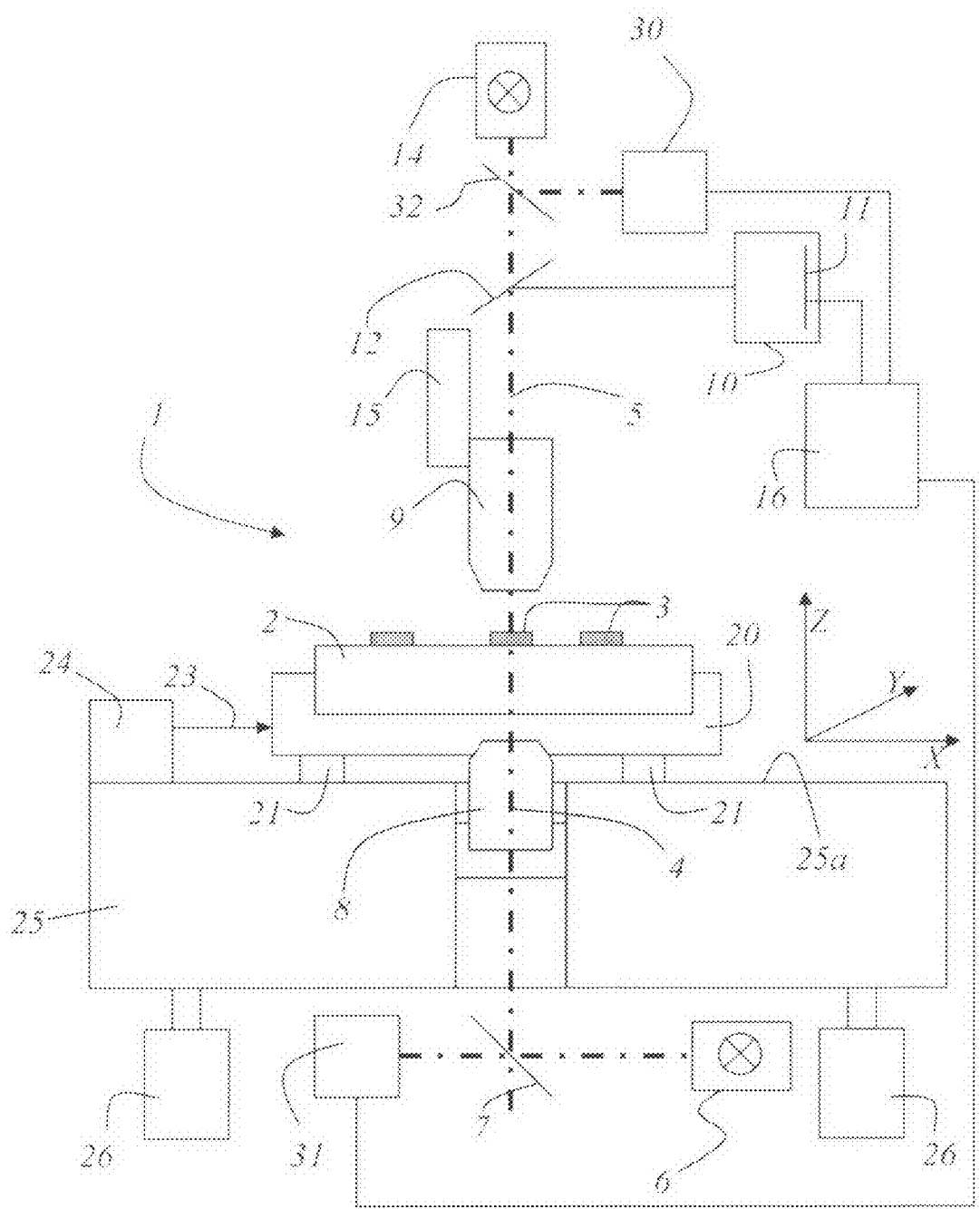
FIG. 1 schematically shows a coordinate measuring device with which the optical properties of a mask may be determined.

FIG. 1 shows a schematic representation of coordinate measuring device 1 according to the present invention. The coordinate measuring device has measurement table 20 carrying mask 2. Measurement table 20 is positioned on air bearings 21 to be movable in the X-coordinate direction and in the Y-coordinate direction. In the embodiment shown, granite block 25 forms plane 25a on which measurement table 20 is movably positioned. The position of the measurement table is determined by means of interferometer system 24 emitting a measurement light beam 23. Granite block 25 is positioned on vibration dampers 26. It is clear to one skilled in the art that any other material may be used for providing plane 25a in which measurement table 20 may be moved. The use of granite block 25 shown here is therefore not to be considered as limiting the invention in any way.

Mask 2 carries a plurality of structures 3 to be measured. Incident light illumination means 14 emitting light along incident light optical illumination path 5 is provided for the illumination of the mask. Similarly, transmitted light illumination means 6 emitting light along transmitted light optical illumination path 4 is provided for the transmitted light illumination of mask 2. The light of transmitted light illumination means 6 is directed to the substrate by means of condenser 8. The light of incident light illumination means 14 reaches mask 2 via measurement objective 9. Measurement objective 9 is arranged to be translatable for focusing in the Z-coordinate direction by means of displacing means 15. In the incident light optical illumination path, there is arranged coupling-out means 12 which directs the light collected from mask 2 and objective 9 to camera 10 including detector 11. Detector 11 is connected to a computer generating a digital image from the acquired signals.

Figure 2A:
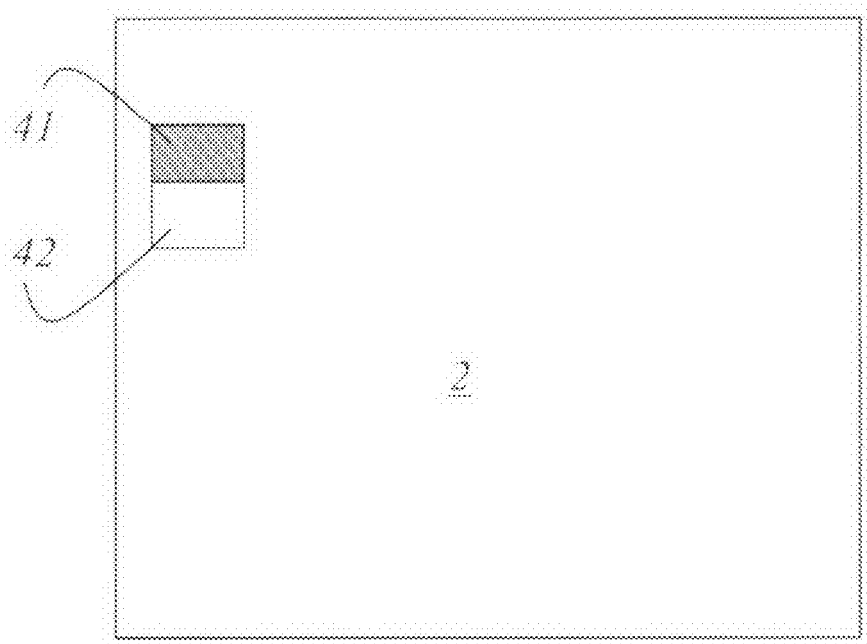
FIG. 2a shows a schematic representation of the mask having at least a first and a second area thereon which are connected to each other and with which the optical properties of the mask may be determined.
Figure 2B:
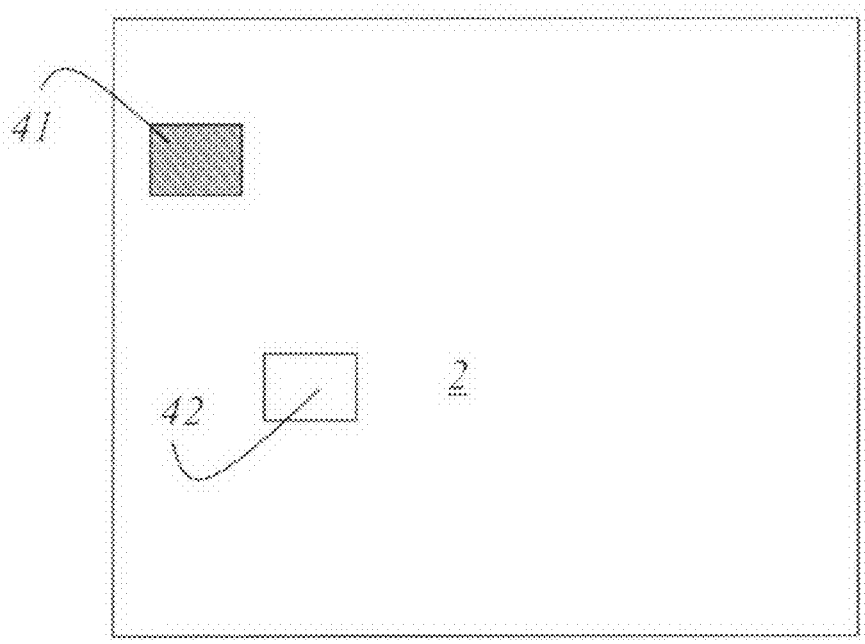
FIG. 2b shows a schematic representation of the mask having at least a first and a second area thereon which are not connected to each other and with which the optical properties of the mask may be determined.

The following paragraph refers to both FIGS. 1 and 2. In order to determine the optical properties of mask 2, measurement table 20 is moved such that first area 41 and/or second area 42 on mask 2 may be imaged by objective 9. First area 41 or second area 42 is thus imaged on detector 11 of the coordinate measuring machine by objective 9. Detector 11 then determines the transmission and/or reflection properties of first or second area 41, 42 based on the acquired data (see FIG. 2a or 2b). In order to prevent fluctuations of incident light illumination means 14 and/or transmitted light illumination means 6 during the examination of first and/or second area 41, 42, part of the light in the respective optical illumination path 4, 5 is directed to at least one monitor detector 30, 31. The signal generated by monitor detectors 30, 31 is also supplied to computer 16 so that potential light fluctuations of transmitted light illumination means 6 and/or incident light illumination means 14 during the measurement of first and/or second area 41, 42 may be compensated. A variety of means may be used to direct part of the light in incident light optical illumination path 5 or in transmitted light optical illumination path 4 to the respective monitor detectors 30, 31. In the embodiment shown, coupling-out mirrors 7, 32 are used, which direct a fraction of the light in incident light optical illumination path 5 and in the transmitted light optical illumination path 4, respectively, to the monitor detector or transmits it to the monitor detector. It is also contemplated that part of the light in incident light optical illumination path 5 or in transmitted light optical illumination path 4 is coupled out by a respective fiber and directed to the corresponding monitor detector. It is clear to one skilled in the art that the suggested manner of coupling out or directing the light to the monitor detectors is only one possibility that may not be considered as limiting the invention in any way.

FIG. 2a shows a schematic view of mask 2 provided with first area and second area 41, 42, which may be used for determining the optical properties of mask 2. First area 42 consists of a material differing from that of second area 42. With the help of first area 41 and second area 42 on mask 2, the optical properties of mask 2, such as transmission and/or reflection, may be examined.

FIG. 2b shows the arrangement of first area 41 and second area 42 not connected to each other. Areas 41, 42 may be arranged at any location on the mask. First area 41 and second area 42 differ in their transmission and reflection properties. The material of areas 41, 42 may, for example, correspond to the material of mask 2 and commonly consist of $SiO_2$. It is also possible that the material of one of areas 41, 42 is a Cr layer or a phase-shifting material, such as MoSi. Areas 41, 42 applied to mask 2 are preferably larger than the resolution of the imaging means or measurement objective 9. In a preferred embodiment, first area 41 and second area 42 or areas 41, 42 together have a size of about 10 μm. In order to determine the transmission and/or reflection properties of mask 2, first and/or second areas 41, 42 may be imaged on detector 11 of the coordinate measuring machine by measurement objective 9, if areas 41, 42 are arranged adjacent to each other.

Figure 3A:
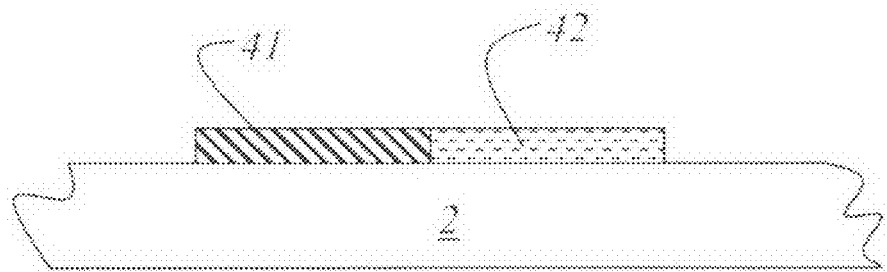
FIG. 3a shows a first embodiment of the arrangement of the first and second areas.

FIG. 3a shows a first embodiment of the arrangement of first area 41 and second area 42 on mask 2. First and second areas 41, 42 are arranged to be adjacent to each other, and they differ in material. In a preferred embodiment, the mask consists of $SiO_2$.

Figure 3B:
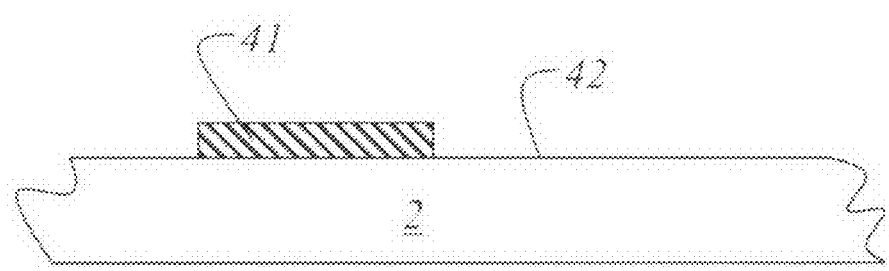
FIG. 3b shows a second embodiment of the arrangement of the first and second areas.

FIG. 3b shows a second embodiment of the arrangement of first area 41 and the second area 42 on mask 2. Second area 42 is a surface of the mask, so that the material of second area 42 corresponds to the material of the mask. The mask preferably consists of $SiO_2$. With this arrangement, the transmittance and/or reflectance of mask 2 may be determined relative to material of first area 41.

Figure 3C:
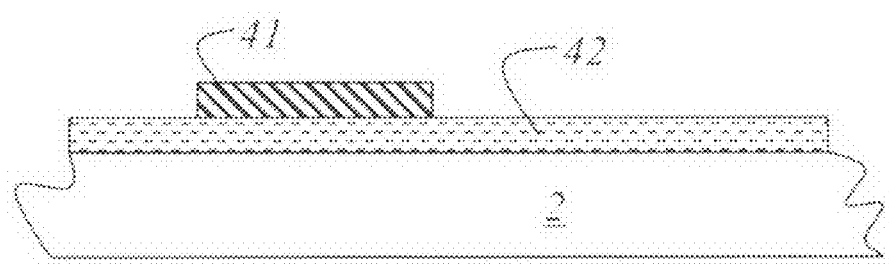
FIG. 3c shows a third embodiment of the arrangement of the first and second areas.

FIG. 3c shows a third embodiment of the arrangement of first area 41 and second area 42 on mask 2. Second area 42 is applied to the surface of mask 2 as an intermediate layer. The mask preferably consists of $SiO_2$. With this arrangement, the transmittance and/or reflectance of the material of first area 41 may be determined relative to the material of second area 42. The transmission/reflection properties are always determined relatively between areas 41 and 42. For this purpose, one area is defined as a reference.

The invention has been described with reference to particular embodiments. However, it is contemplated that modifications and changes may be made to the invention without departing from the scope of the following claims.

What is claimed is:

1. A coordinate measuring machine for determining the optical properties of a mask comprising:
   a movable measurement table for moving the mask within a plane, wherein the mask includes a first area and a second area, wherein the first area and the second area comprise materials differing in their respective transmission or reflection properties with respect to each other;

an illumination means and an imaging means, wherein the imaging means includes an objective and a detector, wherein the objective images the first area and the second area on the detector either sequentially or simultaneously, wherein the illumination means emits light along an incident light optical path or emits a light along a transmitted light optical path; and, at least one monitor detector with an associated coupling-out element for providing the monitor detector with a portion of the light from the illumination means that is directed along at least one of the optical paths.

2. The coordinate measuring machine of claim 1, wherein the first and second areas are arbitrarily distributed on the mask and are not adjacent to each other.

3. The coordinate measuring machine of claim 1, wherein the first and second areas on the mask are arranged such that the first and second areas are adjacent to each other.

4. The coordinate measuring machine of claim 1, wherein the first area and the second area consist of different materials applied to a surface of the mask.

5. The coordinate measuring machine of claim 1, wherein the first area and the second area consist of different materials, wherein the second area comprises a surface of the mask.

6. The coordinate measuring machine of claim 1, wherein the first area and the second area consist of different materials, wherein the first area covers an entire surface of the mask and the second area is partially deposited on the first area.

7. The coordinate measuring machine of claim 1, wherein the first area and the second area on the mask are larger than a resolution of the imaging means.

8. The coordinate measuring machine of claim 7, wherein the first area and the second area have a total size of about 10 μm.

9. A method for determining optical properties of a mask, wherein a coordinate measuring machine includes a measurement table movable in a plane that moves the mask correspondingly in the plane, wherein illumination and imaging means are provided, wherein the imaging means includes at least one objective and a detector, and wherein the illumination means emits light along an incident light optical path or a light source in a transmitted light optical path, comprising the steps of:

(e) providing the mask, wherein the mask includes a first area and a second area wherein the first area and the second area are made of different materials;

(f) imaging sequentially or simultaneously the first and second areas on the detector via the objective, wherein the first and second areas differ in their transmission or reflection properties;

(g) coupling out a portion of the light emitted from the illumination means to at least one monitor detector to generate a signal; and (h) using the signal of the monitor detector to compensate intensity fluctuations of the illumination means between a measuring of the first area and a measuring of the second area.

10. The method of claim 9, wherein the first and second areas are arbitrarily distributed on the mask and are not adjacent to each other.

11. The method of claim 9, wherein the first and second areas are arranged on the mask such that the first and second areas are adjacent to each other.

12. The method of claim 9, wherein the first area and the second area consist of different materials applied to a surface of the mask.

13. The method of claim 9, wherein the first area and the second area consist of different materials, wherein the second area comprises a surface of the mask.

14. The method of claim 9, wherein the first area and the second area consist of different materials, wherein the first area covers an entire surface of the mask and the second area is deposited on the first area.

15. The method of claim 9, wherein the first area or the second area, or a sum of the first and second areas, on the mask is larger than a resolution of the imaging means.

* * * * *